United States Patent
Ratchev et al.

(10) Patent No.: US 7,080,333 B1
(45) Date of Patent: Jul. 18, 2006

(54) VERIFYING LOGIC SYNTHESIZERS

(75) Inventors: Boris Ratchev, Sunnyvale, CA (US); Mike Hutton, Mountain View, CA (US); Gregg Baeckler, San Jose, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/286,374

(22) Filed: Oct. 31, 2002

(51) Int. Cl.
*G06F 17/50* (2006.01)

(52) U.S. Cl. ................................. 716/5; 716/4; 716/6

(58) Field of Classification Search ............... 716/3–6, 716/18, 21; 703/13–16; 702/117–120
See application file for complete search history.

(56) References Cited

U.S. PATENT DOCUMENTS

| | | | | |
|---|---|---|---|---|
| 5,425,036 A * | 6/1995 | Liu et al. | ...................... | 714/735 |
| 5,752,000 A * | 5/1998 | McGeer et al. | ............... | 703/14 |
| 5,903,475 A * | 5/1999 | Gupte et al. | .................. | 703/16 |
| 5,920,830 A * | 7/1999 | Hatfield et al. | ............. | 702/119 |
| 5,991,523 A * | 11/1999 | Williams et al. | .............. | 716/18 |
| 6,009,256 A * | 12/1999 | Tseng et al. | .................. | 703/13 |
| 6,131,080 A * | 10/2000 | Raimi et al. | ................... | 703/14 |
| 6,237,132 B1 * | 5/2001 | Dean et al. | ..................... | 716/18 |
| 6,295,517 B1 * | 9/2001 | Roy et al. | ...................... | 703/15 |
| 6,304,837 B1 * | 10/2001 | Geiger et al. | .................... | 3/14 |
| 6,311,317 B1 * | 10/2001 | Khoche et al. | ............... | 716/18 |
| 6,327,556 B1 * | 12/2001 | Geiger et al. | ................. | 703/13 |
| 6,360,353 B1 * | 3/2002 | Pember et al. | ................. | 716/4 |
| 2003/0074640 A1 * | 4/2003 | Mandell et al. | ................ | 716/3 |

* cited by examiner

*Primary Examiner*—Vuthe Siek
*Assistant Examiner*—Naum Levin
(74) *Attorney, Agent, or Firm*—Townsend and Townsend and Crew, LLP

(57) ABSTRACT

Methods and code for verifying that modifications or improvements to a synthesizer algorithm do not introduce errors. Specifically, a number or VHDL or Verilog models are chosen. Two netlists are then synthesized from each modeled circuit, once using a unmodified or trusted synthesizer, and once using the modified or improved synthesizer. For each circuit, a set of input test vectors are generated. These vectors are somewhat random in nature, but modified or generated intelligently using knowledge about the circuit to be testing. For each circuit, each netlist is simulated, generating a set of output vectors. These output vectors are compared. If the output vectors match each other for each of the circuits tested, there is a high probability that the improved or modified synthesizer is not introducing new errors into the netlist.

21 Claims, 7 Drawing Sheets

510 — INPUTS clk1 clk2 asy_hi1 asy_both1 asy_both2 asy_lo1 in1 in2 in3 bidir ;
520 — CLOCKS clk1 clk2 ;
530 — ASYNCH_MOSTLY_HI asy_hi1 ;
540 — ASYNCH_MOSTLY_LO asy_lo1 ;
550 — ANY_ASYNCH asy_both1 asy_both2 ;
560 — OUTPUTS out1 out2 out3 bidir ;

FIG. 5A

570 — FREQ 1
The setup time (ms)used. Inputs change one or more tsu steps before the clock's rising edge.
580 — TSU 0.5
The clock's duty cycle.
590 — DUTY_CYC 0.1
Length of the random vector is MAX-CYCLES* Period
595 — MAX_CYCLES 100

FIG. 5B

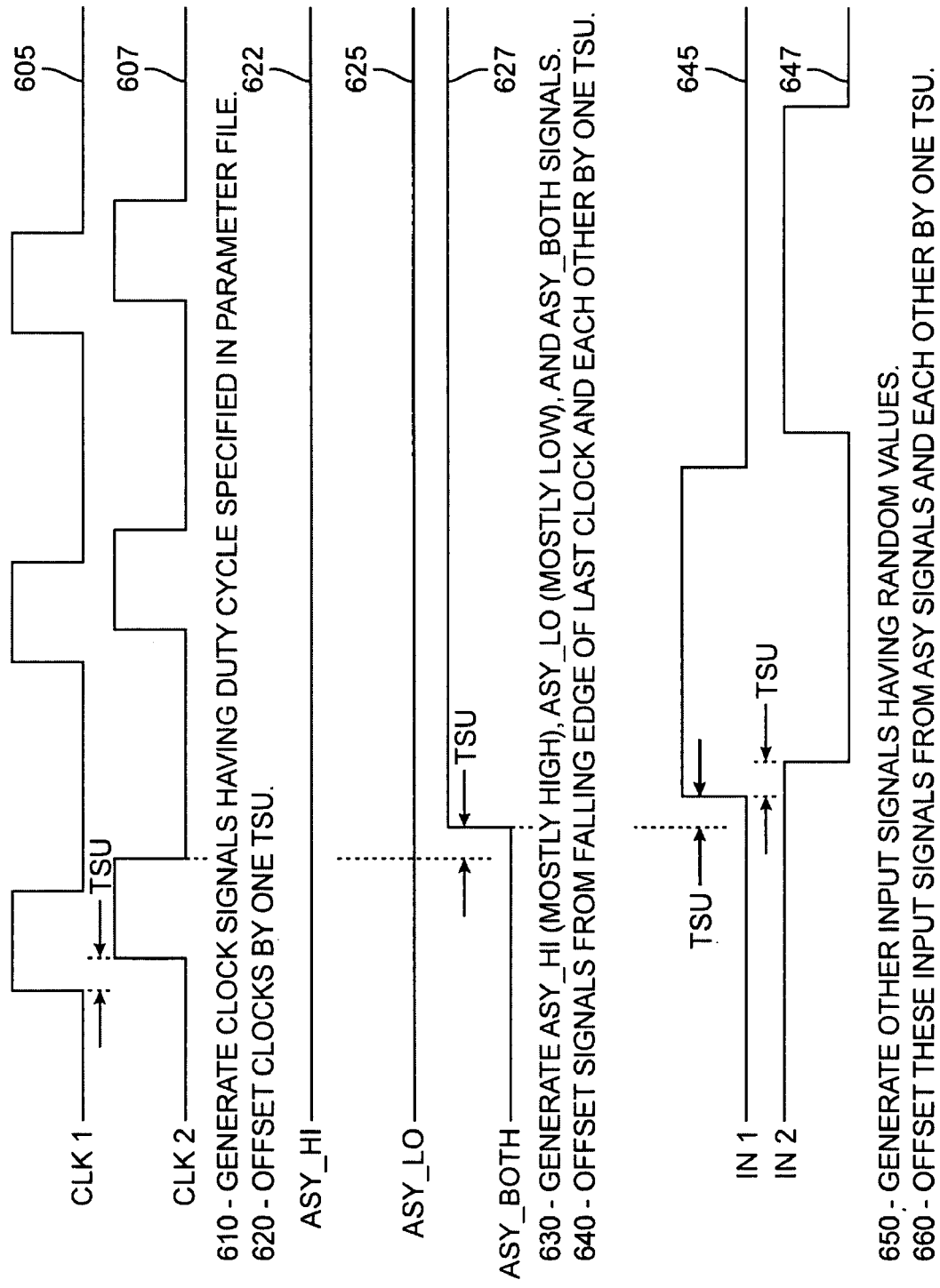

VERIFYING LOGIC SYNTHESIZERS

BACKGROUND

The present invention relates to the verification of software tools used in the design of integrated circuits, and more particularly to the verification of logic synthesizers and the generation of test vectors for the verification.

In the past, simple logic circuits could be designed by hand. That is, circuit designers could place logic functions such as OR gate and flip-flops on an integrated circuit and realize a desired function. But modern circuits are often made up of several thousand logic functions or gates. For example, a typical circuit may include 40 thousand look-up tables or 100 thousand gates. Accordingly, more powerful ways of representing logic functions have been developed. Among these are VHDL (VHSIC hardware description language, VHSIC is very high speed integrated circuit) or Verilog modeling.

VHDL or Verilog are software methods of modeling complicated logic functions by comparatively simple equations. These models are provided to a synthesizer, which ideally implements the equations in a minimum number of gates to generate a netlist. This netlist may then be used to make an integrated circuit product.

A synthesizer may be thought of as a collection of algorithms used to convert VHDL or Verilog models to a logical netlist. Often, one or more of these algorithms are updated or modified. When this happens, there is a concern about the accuracy of the updated synthesizer. This concern is exacerbated since the synthesizer is disigned and used by two separate parties, that is, the synthesizer is typically provided by a vendor, while it is used by customer of the vendor.

Also, difficulties arise when verifying the accuracy of a synthesizer. Minor software errors may lead to minor errors in the netlist that may be very difficult to find. The presence of an error in the synthesizer software does not mean that every VHDL or Verilog model is incorrectly netlisted. Also, once a particular netlist has been generated, it is often very time consuming to test the functionality of each and every node of the circuit, thus errors may pass unnoticed.

Thus, what is needed is a thorough method of testing logic synthesizers. This method should provide a high probability of catching errors introduced by modifications and improvements made to synthesizer algorithms.

SUMMARY

Accordingly, exemplary embodiments of the present invention provide methods and code for verifying that modifications or improvements to a synthesizer algorithm do not introduce new errors as compared to the synthesizer before modification or improvement. Specifically, a number of VHDL or Verilog models are chosen. Two netlists are then synthesized from each modeled circuit, one using a unmodified or trusted synthesizer, and one using the modified or improved synthesizer. For each circuit, a set of input test vectors are generated using information from the trusted synthesizer. These vectors are somewhat random in nature, but modified or generated intelligently using knowledge about the circuit to be tested. For each circuit, bot netlists are simulated, generating two sets of output vectors. These sets of output vectors are compared. If the two sets of output vectors match each other for each of the circuits tested, there is a high probability that the improved or modified synthesizer is not introducing errors into the netlist, at least as compared to the unmodified synthesizer.

Another exemplary embodiment of the present invention provides a method of verifying a logic synthesizer. The method includes, for each of a plurality of VHDL models, generating a first netlist using a first synthesizer, simulating the first netlist using a plurality of test vectors to generate a first plurality of output vectors, generating a second netlist using a second synthesizer, simulating the second netlist using the plurality of test vectors to generate a second plurality of output vectors, and comparing the first plurality of output vectors with the second plurality of output vectors.

A further exemplary embodiment of the present invention provides a method of generating vectors for use in simulating a netlist for an integrated circuit. This method includes identifying at least one clock signal, identifying a plurality of input signals, determining for each of the plurality of input signals whether each input signal should have a value that is typically high, typically low, or random, and identifying at least one output.

Yet another exemplary embodiment of the present invention provides a computer program stored on a computer-readable storage medium for verifying a logic synthesizer. The computer program includes code for receiving a first plurality of output vectors from a first simulation of a first netlist generated using a first logic synthesizer, code for receiving a second plurality of output vectors from a second simulation of a second netlist generated using a second logic synthesizer, and code for comparing the first plurality of output vectors with the second plurality of output vectors.

A better understanding of the nature and advantages of the present invention may be gained with reference to the following detailed description and the accompanying drawings.

BRIEF DESCRIPTION OF THE DRAWINGS

FIG. 5A is an exemplary signal information file generated by a synthesizer and FIG. 5B is an exemplary parameter file for use in generating test vectors for a netlist simulation in accordance with an embodiment of the present invention;

FIG. 6 is a flow chart showing a method of generating simulation vectors in accordance with an embodiment of the present invention.

DESCRIPTION OF EXEMPLARY EMBODIMENTS

Figure 1:
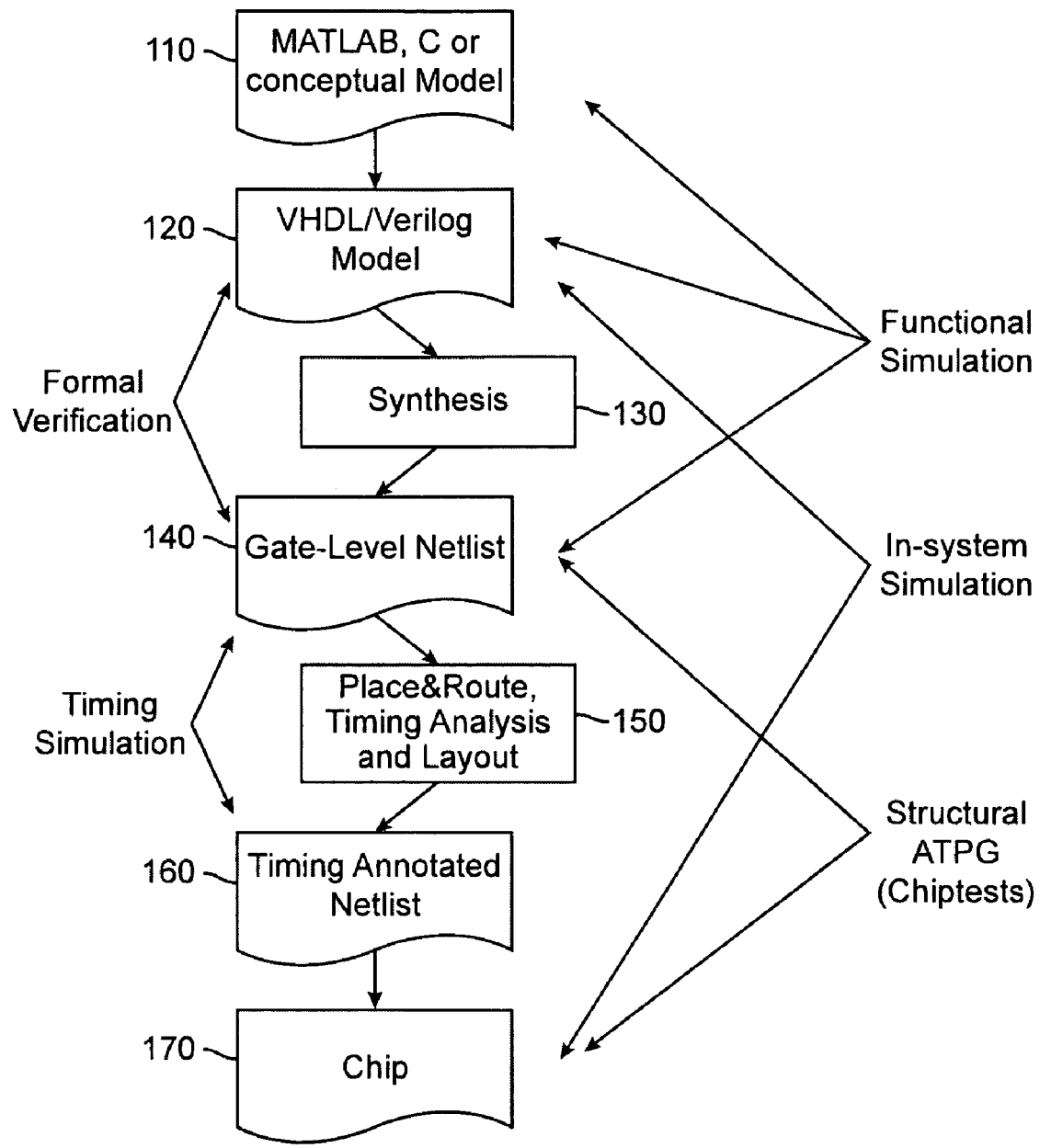
FIG. 1 is a flow chart showing acts and files used in a design process that may benefit by the use of embodiments of the present invention.

FIG. 1 is a flow chart showing the acts in a design process that may benefit by the use of embodiments of the present invention. This figure, as with all the included figures, is shown for exemplary purposes only and does not limit either the possible embodiments of the present invention or the claims.

To begin, a Matlab, C, conceptual, or other model file 110 is generated. This model 110 is a logical representation of a function to be performed by a final integrated circuit or integrated circuit portion. From this, a VHDL, Verilog, AHDL (Altera hardware description language), or other HDL model 120 (referred to as simply a VHDL or Verilog model) is generated. Alternately, the VHDL or Verilog model may be generated directly, skipping generation of the model file 110. This model is synthesized in act 130 to generate a gate level netlist 140. Specifically, the VHDL or Verilog model 120 is converted to a non-optimized gate level netlist, made up of gate level logic functions such as OR, NAND, and other gates, as well as flip-flops, latches, pass gates, multiplexers, and other logic functions. This non-optimized netlist is "optimized," that is, improved or simplified, by the synthesizer 420. The optimized netlist undergoes a process referred to as technology mapping. For example, logic gates may be converted to look-up tables, product terms, or similar functions, particularly if the end integrated circuit is an FPGA or PLD. The conversion of the VHDL or Verilog model 120 to a gate level netlist 140 may be referred to as synthesis or formal verification.

The gate level netlist 140 is then fitted to an integrated circuit layout using a place and route program. From the physical locations of the gates, and other information such as routing distances, a timing analysis may also be done in act 150. From the fitted design, an annotated netlist 160 including timing information may be generated. This netlist is used to generate the final integrated circuit 170. Timing simulations may be performed on the gate level netlist 140, the timing annotated netlist 160, or both. The integrated circuit 170 may be a programmable logic device, filed programmable gate array, or other integrated circuit.

Figure 2:
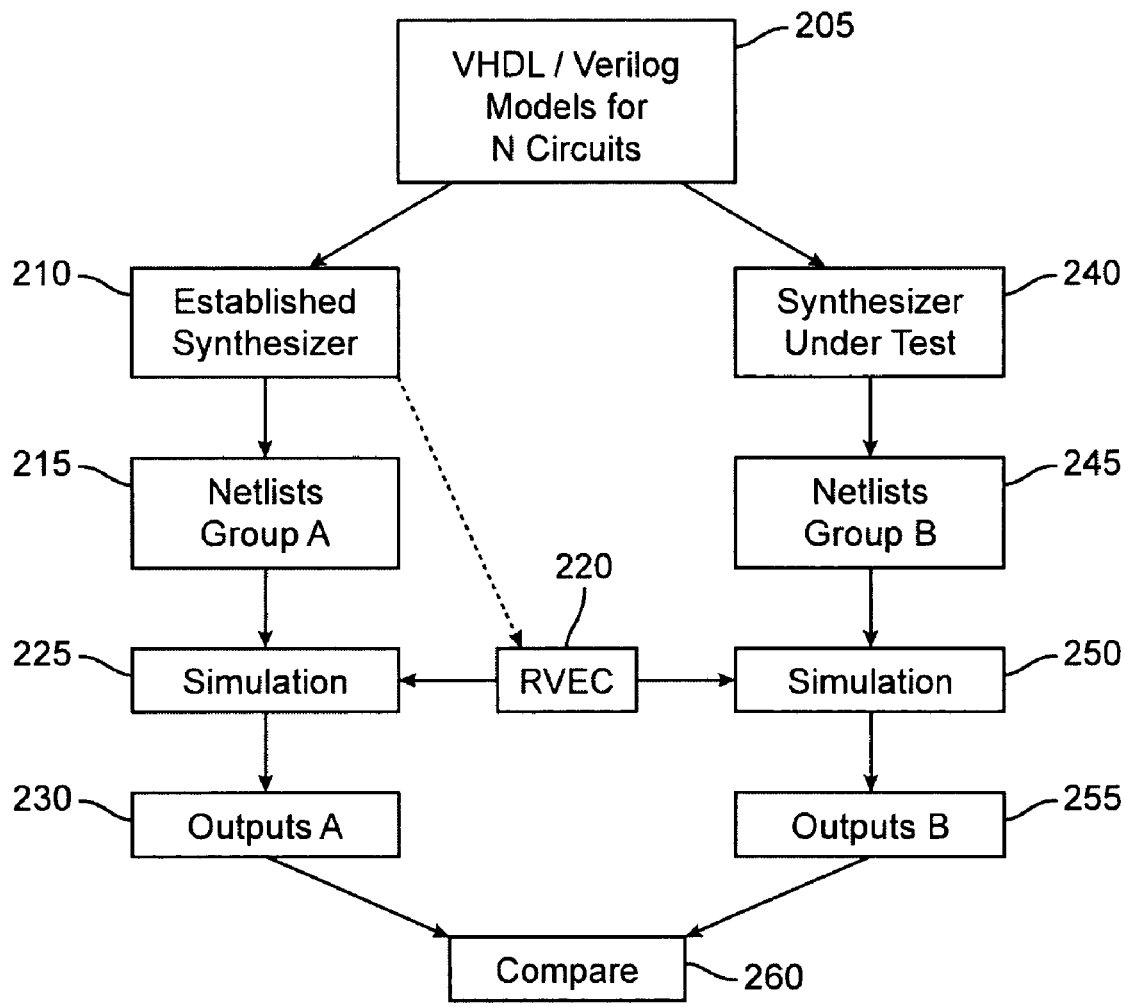
FIG. 2 is a flow chart of a method of verifying a synthesizer in accordance with an embodiment of the present invention.

FIG. 2 is a flow chart of a method of verifying a synthesizer in accordance with an embodiment of the present invention. VHDL or Verilog models 205 are generated for a number N circuits. N can be any number, the larger N is, the more confidence there is that a verification has been done correctly, though the process becomes more time consuming. These models may be from actual production circuits, they meet be tailor made for this verification process, or they may be generated for some other reason. These circuits may also be selectively chosen to avoid known problems, as will be discussed below.

The models 205 are then synthesized using an established or trusted to synthesizer 210 in order to generate a group of netlists 215. For each netlist, a set of test vectors RVEC 220 are generated. In a specific embodiment of the present invention, the established synthesizer 210 provides information relating to the input and output pins of the netlist being synthesized. Each of the group of netlists 215 is simulated using its respective test vectors 220 to generate a set of output vectors A 230.

The VHDL or Verilog models 205 are synthesized using the synthesizer under test 240 to generate a second group of netlists, group B 245. The synthesizer under test is typically the established synthesizer 210 with modifications or improvements to one or more of its algorithms. The group B netlists 245 are simulated using the same input test vectors RVEC 220 to generate a second set of output vectors B 225.

The outputs from the two simulations for each of the N circuits are compared against each other. When the outputs matched for each circuit, there is a likelihood that the synthesizer under test 240 is not introducing new errors in the synthesizer netlists, at least as compared to the established synthesizer 210. The likelihood of this, and the confidence in the modified netlist increases when the number N is increased. If the outputs for one or more circuits do not match, there is a chance that the synthesizer under test 240 is introducing errors. Alternately, an individual circuit for which the outputs do not match may have a characteristic such that it is not a good candidate for use in this type of verification.

The reference or group A vectors may be stored ahead of time, before any changes to the synthesizer are made, in order to speed the verification process. Also, one set of vectors may be stored and used for more than one generation of changes or modifications to the synthesizer. For example, the vectors might not be updated for each minor revision of the synthesizer, but rather several updates may be verified using one set of vectors.

It should be understood that the two netlists for each VHDL or Verilog models cannot be meaningfully compared to each other in an attempt to verify the synthesizer. Often, the very goal of a modification to the synthesizer is made so that the synthesizer can convert a VHDL or Verilog model to a simpler gate level netlist. In this case, the two netlists are often different, but the end logic function, as expressed by the simulation output vectors, should be the same.

It should also be understood that the goal of this verification is not to ensure that any particular VHDL or Verilog model is being netlisted correctly, though this is an indirect result. Also, the goal is not to verify that the synthesizer is generating correct netlists in an absolute sense, though synthesizers are certainly improved. Rather, the goal is to verify that if one or more of the algorithms in a synthesizer is improved or modified, that such improvement or modification does not introduce errors into netlists as compared to the synthesizer before improvement or modification.

This flow may be modified in many ways consistent with the present invention. For example, the group A and group B netlists may be placed and routed, and timing analysis done to generate two timing annotated netlists, each similar to netlist 160 in FIG. 1. These netlists may be simulated, generating output vectors which are then compared.

Also, note that if the synthesizers 210 and 240 are the same, other programs in the flow, such as the place and route program, may be modified and verified. For example, during place and route, late physical synthesis could introduce new error into the netlist. Specifically, a VHDL or Verilog model is synthesized generating a netlist. This synthesis may again generate information to be used in generating simulation input vectors. The netlist is then place and routed using both a trusted place and route program and a modified or improved place and route program, resulting in two timing annotated netlists. Each of these timing annotated netlists are simulated using the input vectors to generate two sets of output vectors. The two sets of output vectors are compared. As before, this process can be repeated for any number of VHDL or Verilog models in order to gain more confidence that the modified place and route program is not introducing errors into the timing annotated netlists as compared to the trusted place and route program.

This flow is described for the situations where a synthesizer or place and route program that has been modified is being tested. Additionally, other programs used in the design flow of FIG. 1, or other CAD flows, can be similarly verified with little change to the steps outlined here. For example, two simulators could be compared, though only one group of netlists should be provided as inputs to the simulators.

The various programs above may be incorporated into one automated procedure, or they may be split into one or more stand-alone programs.

Figure 3:
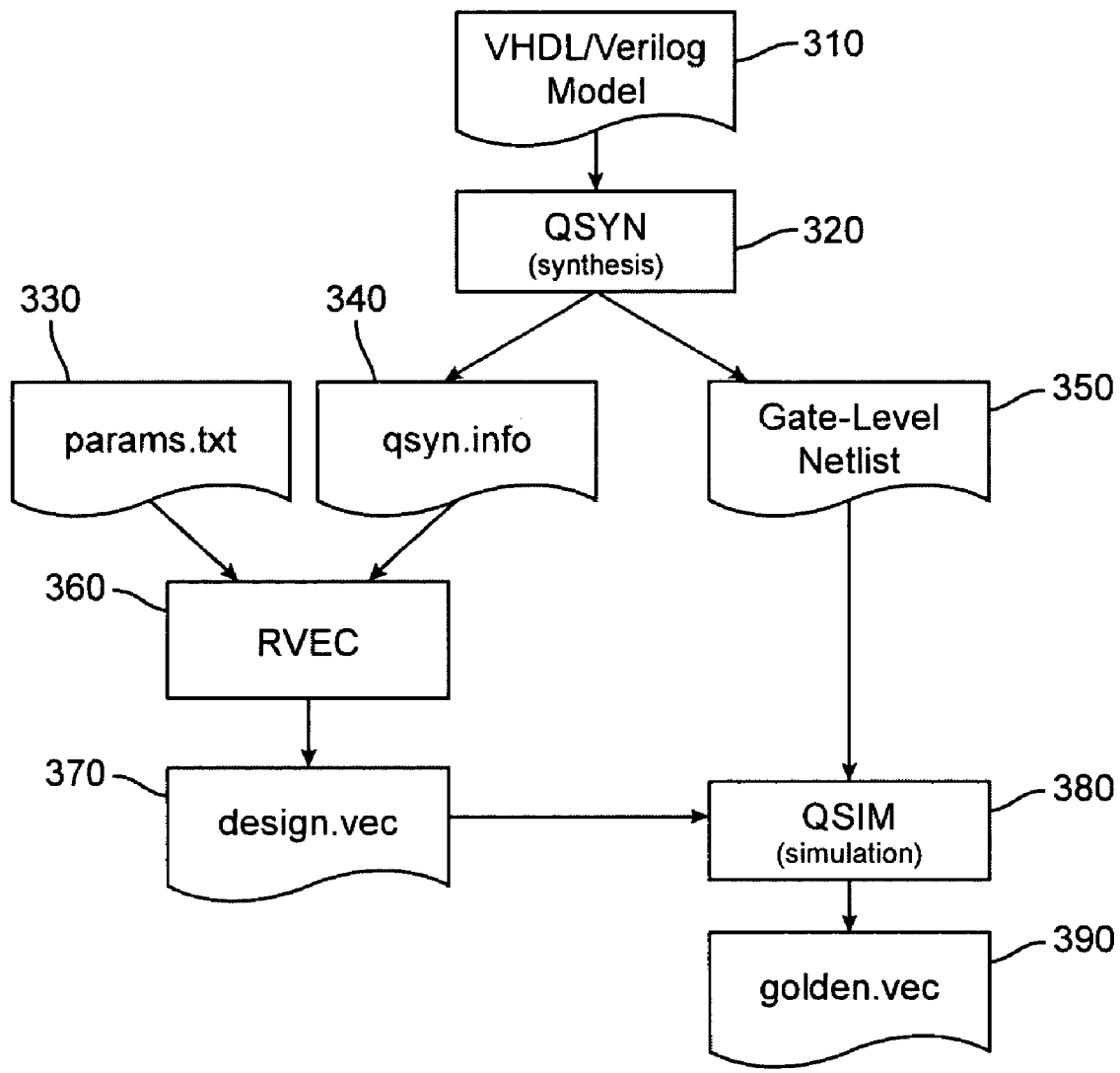
FIG. 3 is a flow chart of a method of generating reference output vectors in accordance with an embodiment of the present invention.

FIG. 3 is a flow chart of a method of generating reference or "golden" output vectors in accordance with an embodiment of the present invention. Again, a VHDL or Verilog model 310 is generated. This model is input to a synthesizer, such as Quartus II available from Altera Corporation, 101 Innovation Drive, San Jose, Calif., 95134. The synthesizer provides a gate level netlist 350 as before. The synthesizer also provides an information file 340 containing information about the input and output pins of the modeled circuit.

The information file 340 and a parameter file 330 are used by a vector generation program 360 to generate input vectors 370. Simulation program 380 receives the gate level netlist 350 and the input vectors 370 and generates a set of output vectors 390. These output vectors may be referred to as golden vectors since they form a benchmark against which modified synthesizers are verified. This process may be repeated for any number of VHDL or Verilog models 310. Again, the use of more models increases the confidence that a modified synthesizer is not introducing errors into netlists, but the time needed to verify the modified synthesizer is increased.

Figure 4:
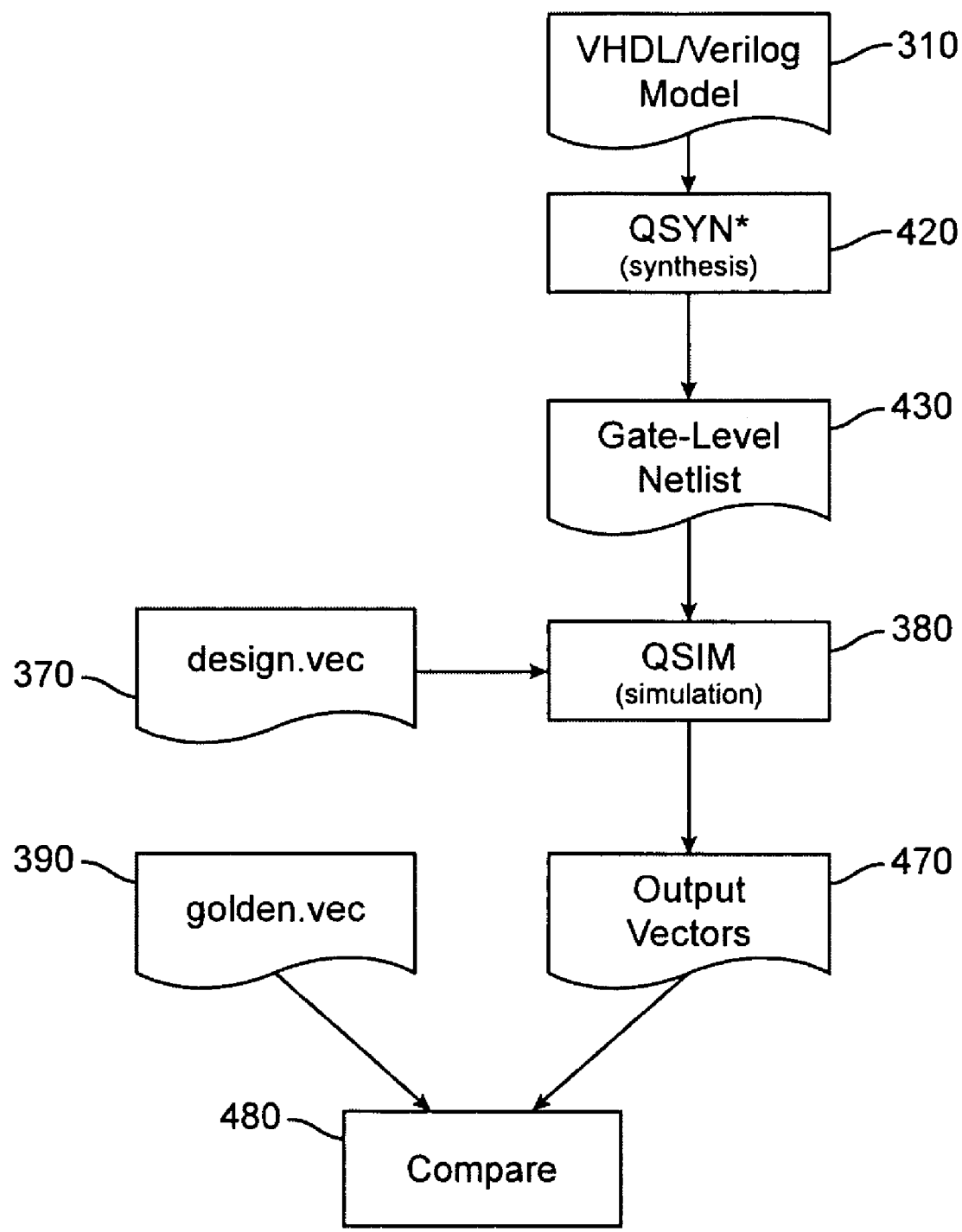
FIG. 4 is a flow chart illustrating a portion of a method of verifying a synthesizer in accordance with an embodiment of the present invention.

FIG. 4 is a flow chart illustrating a portion of a method of verifying a synthesizer in accordance with an embodiment of the present invention. Again, the VHDL or Verilog model 310 is provided. The same VHDL or Verilog models should be used for a meaningful comparison. The Verilog model 310 is received by a modified or improved synthesizer 420, which provides a gate level netlist 430. The input vectors 370, and the gate level netlist 430 are received by the same simulator 380 as was used previously.

The simulator 380 provides a set of output vectors 470. These vectors may be compared to the output or golden vectors 390 previously generated. A comparator then determines whether the output vectors match. Again, this process may be repeated any number of desired times.

If the golden vectors 390 and output vectors 470 to do not match for a particular netlist, it might be that an error has been introduced by the improvement or modification made to the synthesizer under test 420. Alternately, it might be that the circuit itself is such that even when properly netlisted, simulations of the two netlists result in different output vectors.

For example, the netlists may contain what may be referred to as a big combinational loop, or it may contain a "self" loop. A big combinational loop is a loop in the netlist containing no registers that does contain more than one node. A self loop is a node whose non-registered output feeds back into one of its inputs. Depending on how such loops are implemented, different output vectors may result, even though both netlists are proper and no errors are introduced by modifications or improvements to the synthesizer. Once a circuit containing one or more of these loops is identified, it may simply be removed from the pool of VHDL or Verilog models 310 used in the verification process. It is desirable to have a "vetted" pool of VHDL or Verilog models 310 to use since each mismatch should be explained before a modification to a synthesizer can be verified.

FIG. 5A is an exemplary signal information file generated by a synthesizer for use in generating test vectors for a netlist simulation in accordance with an embodiment of the present invention. FIG. 5A is an information file such as the information file 340 in FIG. 3. Line 510 identifies the inputs to the circuitry modeled by the VHDL or Verilog model 310. Specifically, pin names and types are identified. For example, line 520 identifies two clock inputs, clk1 and clk2.

Rather than simply assigning random values to all inputs, the synthesizer identifies signals as being mostly high, mostly low, or having any value. By identifying signals in this way, test coverage through the netlist is improved. For example, when a clear line to a flip-flop is high, the flip-flop is cleared and changes at its data and clock inputs do not result in changes at its output. Accordingly, is it is desirable that this clear line is mostly low such that the flip-flop may be exercised. That is, this signal should typically be low such that circuitry connected to the output of the flip-flop has a better chance of being tested. Line 530 identifies a signal asy_hi1 that is asynchronous to the clock signals and should typically be high. Such a signal may drive a reset bar input of the flip-flop, for example.

Similarly, line 540 identifies and input as being mostly low, while line 550 identifies two inputs, which may be data inputs for example, as signals which may be randomly either high or low.

A thorough test coverage of the netlist is important to the verification of the synthesizer. The more thorough the test coverage of each netlist is, the greater the likelihood of catching an error in the netlist caused by a modification or improvement to the synthesizer. At an extreme, a 100 percent test coverage would catch any error in the netlist. Anything less than 100 percent test coverage means that an error may go undetected for a particular netlist. For this reason, more than one VHDL or Verilog model should be used in the verification process.

FIG. 5B is an exemplary parameter file for use in generating test vectors for a netlist simulation in accordance with an embodiment of the present invention. Line 570 identifies the fundamental frequency to be used in generating the vectors, while line 580 identifies the set-up time, that is the time that an input signal change should lead a rising edge of a corresponding clock signal. Line 590 identifies the duty cycle of the clock signals, while line 595 specifies the duration of the simulation in cycles.

FIG. 6 is a flow chart showing a method of generating simulation vectors in accordance with an embodiment of the present invention. A vector is a set of values for each input signal in the design at a particular time. An example is a vector that specifies the values of three input signals as 0, 0, and 1 at time 102.5 ns or whatever units our vector file specifies:

102.5>001

The input vectors are initialized as having a value X (don't care) for each clock rising edge. In act 610, the clock inputs, in this example clk1 605 and clk2 607 are generated. The number of clocks and other input signals depends on the circuit to be simulated. The duty cycle of the clock is set by the parameter file 330. In act 620, the rising and falling edges of the clocks are offset from each other by one set-up time $T_{su}$, that is, the clocks are delayed relative to each other by a $T_{su}$ as indicated. In act 630, the asy_hi, asy_lo, and asy_both signals are generated. Again, signals such as clear and reset lines should typically be mostly high or low to improve test coverage. Some signal lines may act as a clear (active high) for one circuit and a clear bar (active low) for another circuit. To improve test coverage, these signals should alternate high and low to allow each circuit a chance to switch.

In a specific embodiment of the present invention, the asy_hi signals are high except when reset low for one clock cycle 5 times each simulation. In this embodiment, the asy_lo signals are inverted versions of the asy_hi signals. In this specific embodiment, the asy_both signals are allowed to switch 10 times during a simulation. In other embodiments, these signals may switch at other times, for example, they may switch different numbers of times during the simulation, and they may switch periodically or randomly.

These vectors are offset from the falling edge of the last clock signal by a set-up time in act 640. The vectors are also offset from each other by a set-up time. In act 650 the other input signals are generated. These inputs are allowed to randomly change (or have random values) every clock cycle. That is, each clock cycle they have a 50% chance of changing value, and a 50% chance of being at a particular level. In act 660, these input signals are offset from the above input signals, and from themselves, by a set-up time.

In a specific embodiment of the invention, the set-up times for each of these offset is the same, and is long enough for the transient waveforms at the nodes in the netlist being simulated to settle. In other embodiments, these set-up times may vary. Also in the specific embodiment, the offsets are delays, that is each signal is delayed relative to the previously generated signal. In other embodiments, these offsets may be advances, or a combination of advances and delays. If the rising edge of the first clock is placed a tsu after the last input signal change, then the total number of signals multiplied by tsu multiplied by the number of cycles gives the total simulation time.

The above results in very fast vector generation times. A specific embodiment requires less than a minute for designs of about 10–20 thousand logic elements and about 5 minutes for a 50,000 logic element design. The simulation may be run a reasonable number of cycles, for example about 1000 clock cycles has been found to be an adequate vector length for most designs.

This flow allows automatic generation of test vectors that result in improved test coverage. This can be combined with automatic simulation and output vector comparison such that changes and improvements to a synthesizer algorithm may be verified quickly without a great deal of engineering effort. An alternate to this automatic generation is to simply generate random vectors, then modify them to achieve better test coverage. This "genetic" algorithm requires a great deal of engineering involvement, and is ill suited to the generation of vectors for several netlists.

A specific embodiment has been refined to produce vectors with simulation coverage of 67% on average for designs smaller than 5 thousand logic elements and 40% for larger designs. Simulation coverage is the percentage of nodes in the netlist that change value during simulation. Also, a purposely introduced synthesis error can be detected in designs with a probability of 50.6% for designs smaller than 5 thousand logic elements and of 22.1% for larger designs. It is important to note that a 22.1% error detection rate means that if one hundred designs are tested, the probability of missing the synthesis error in all one hundred designs is $(0.221)^{100}$, which is approximately 2.7E-66.

Ensuring that no two signals change state at the same time prevents what may be referred to as false positives. That is it prevents mismatches in output vectors generated during simulations of netlists made by trusted and modified synthesizers.

This can be seen from a simple example. If a data input to a flip-flop changes nearly simultaneously with a rising (active) edge at its clock input, the output state of the flip-flop may be indeterminate. Non critical changes in the netlist may result in the data inputs transition either being captured or not by the flip-flop. (Also, the output may become metastable, or oscillatory.) Accordingly, small non-critical variations in the netlists may result in the different output vectors. For this reason, an embodiment of the present invention ensures that sufficient time is allowed for all transients in the circuit to settle following each input signal change.

Figure 7:
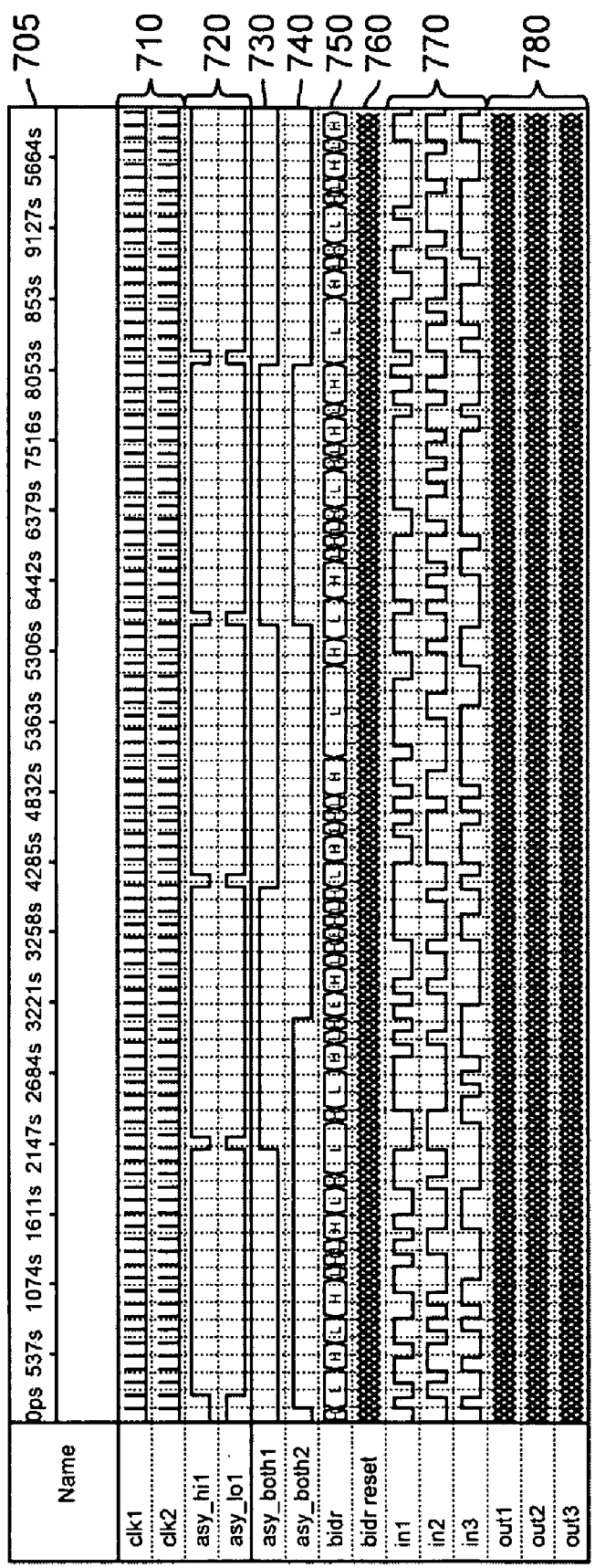
FIG. 7 shows input signal waveforms or simulation stimulus generated in accordance with an embodiment of the present invention.

FIG. 7 shows input signal waveforms generated in accordance with an embodiment of the present invention. These input waveforms are the stimulus applied to a netlist during simulation. The timescale for the simulation is shown as 705. This simulation is not a performance simulation, that is, it is not run to check critical timing paths, delays, and the like. Rather, it is simply measuring the response of the circuit to a given input signal change. In this sense it can be considered almost a DC simulation.

In this file, there are four types of signals shown, as discussed above. The clock signals, clk1 and clk2 710, have a low duty cycle, and they switch as specified in the parameter file. The input vectors change while the clock signals are low. The clock signals are high for enough time for the transitions at the various nodes in the circuit to settle. Signals 720 are mostly high or mostly low, while signals 730 and 740 are high or low as discussed above, and switch less frequently than the other input signals. Again, in this specific example, the mostly high and low signal are reset 10 times during the simulation, while signals 730 and 740 are allowed to change 5 times. Input signals 770 transition randomly high or low each clock cycle. The outputs have a value of X since there are no simulation results in this file. In a specific example, a 100 cycle vector is used, inputs get a chance to change every cycle, asynchronous-both have a chance to change every 10 cycles, and asynchronous-high or low pins get reset (not random) every 20 cycles.

The foregoing description of specific embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of verifying a logic synthesizer comprising:
   for each of a plurality of HDL models:
      generating a second synthesizer from a first synthesizer by modifying a circuitry of the first synthesizer to generate a circuitry of the second synthesizer, wherein respective modeled functions of the circuitry of the first synthesizer and corresponding circuitry of the second synthesizer are the same;
      generating a first netlist from an HDL model using the first synthesizer;
      simulating the first netlist using a plurality of test vectors to generate a first plurality of output vectors;
      generating a second netlist from the HDL model using the second synthesizer;
      simulating the second netlist using the plurality of test vectors to generate a second plurality of output vectors;
      comparing the first plurality of output vectors with the second plurality of output vectors; and
   determining if any mismatch between the first plurality of output vectors and the second plurality of output vectors is from corresponding circuitries of the first synthesizer and the second synthesizer, wherein the corresponding circuitries each provides a corresponding netlist having different output vectors.

2. The method of claim 1 wherein the first synthesizer provides information relating to a plurality of input and output pins of the first netlist.

3. The method of claim 2 wherein the information relating to at least one input pin in the plurality of input and output pins relates to whether the input pin should typically have a logic level that is high, low, or random.

4. The method of claim 1 wherein the plurality of HDL models are for programmable logic devices.

5. The method of claim 1 wherein the test vectors are such that during simulation, no two input signals change state simultaneously.

6. A method of generating a plurality of input vectors for use in simulating a netlist, the method comprising:
receiving an HDL mode;
generating a netlist and an information file from the HDL model using a synthesizer; and
receiving a parameter file, wherein the parameter file comprises information relating to generating a plurality of input vectors; and
generating the plurality of input vectors using the information file and the parameter file,
wherein the information file comprises information relating to a plurality of input and output pins of the netlist, wherein the information relating to at least one input pin in the plurality of input and output pins relates to whether the input pin should typically have a logic level that is high, low, or random, and wherein the plurality of input vectors are such that no two input signals change state simultaneously.

7. The method of claim 6 wherein the netlist is a netlist for at least a portion of a programmable logic device.

8. The method of claim 6 wherein the HDL model is a model for a field programmable gate array.

9. A method of verifying a logic synthesizer comprising:
for each of a plurality of HDL models:
generating a first netlist from an HDL model using a first synthesizer capable of synthesizing the first netlist from the HDL model to generate a first synthesizer logic design;
generating a second netlist by place and routing the first netlist to fit an integrated circuit layout;
modifying the first synthesizer logic design to generate a second synthesizer, wherein the functional operation of the second synthesizer corresponds to the functional operation of the first synthesizer;
generating a third netlist from the HDL model using the second synthesizer;
generating a fourth netlist by place and routing the third netlist to fit the integrated circuit layout;
simulating the second netlist using a plurality of test vectors derived from the first synthesizer to generate a first plurality of output vectors;
simulating the fourth netlist using the plurality of test vectors to generate a second plurality of output vectors;
comparing the first plurality of output vectors with the second plurality of output vectors; and
determining whether or not any difference found between the first plurality of output vectors and the second plurality of output vectors is due to corresponding circuits associated with the second netlist and the fourth netlist that generate different output vectors from the test vectors.

10. The method of claim 9 wherein the fourth netlist is generated by place and routing the third netlist on a field programmable gate array.

11. A method of verifying a place and route program comprising:
generating a first netlist using a synthesizer;
generating a second netlist by place and routing the first netlist using a first place and route program to fit an integrated circuit layout;
generating a third netlist by place and routing the first netlist using a second place and route program to fit the integrated circuit layout, wherein the second place and route program is derived from the first place and route program;
generating a first set of output vectors by simulating the second netlist using a set of input vectors;
generating a second set of output vectors by simulating the third netlist using the set of input vectors;
comparing the first set of output vectors and the second set of output vectors; and
determining if any difference between the output vectors are caused by correctly routed second netlist and third netlist that generate different output vectors in response to the set of input vectors.

12. The method of claim 11 wherein the set of input vectors is generated using information from the synthesizer.

13. The method of claim 11 wherein the third netlist is generated by place and routing the first netlist on a field programmable gate array.

14. A method of verifying a logic synthesizer comprising:
for each of a plurality of HDL models:
generating a first netlist from an HDL model using a first synthesizer configured to generate the first netlist in response to logic circuitry data of the HDL model;
simulating the first netlist using a plurality of test vectors to generate a first plurality of output vectors;
modifying a logic design of the first synthesizer to generate a second synthesizer, wherein the functional operation of the first synthesizer and the second synthesizer is the same;
generating a second netlist from the HDL model using the second synthesizer;
simulating the second netlist using the plurality of test vectors to generate a second plurality of output vectors;
comparing the first plurality of output vectors with the second plurality of output vectors; and
determining if any differences found from the comparison of the plurality of output vectors to the second plurality of output vectors are caused by corresponding logic designs functions of the first synthesizer and the second synthesizer that are functionally equivalent.

15. The method of claim 14 wherein at least one of the plurality of HDL models is a model for a device to be implemented on a field programmable gate array.

16. A method of verifying a logic synthesizer comprising:
for each of a plurality of HDL models:
generating a first gate level netlist from an HDL model using a first synthesizer;
simulating the first netlist using a plurality of test vectors to generate a first plurality of output vectors;
generating a second gate level netlist from the HDL model using a second synthesizer, wherein the second synthesizer is generated by modifying logic circuits of the first synthesizer and wherein the second synthesizer is configured to provide the same input/output function as the first synthesizer;

simulating the second gate level netlist using the plurality of test vectors to generate a second plurality of output vectors;

comparing the first plurality of output vectors with the second plurality of output vectors; and determining if any errors found in the comparison are due to corresponding logic circuits of the first synthesizer and the second synthesizer that are functionally the same but generate different output vectors.

17. The method of claim 16 wherein at least one of the plurality of HDL models is a model for a device to be implemented on a field programmable gate array.

18. A method of verifying a logic design synthesis comprising:

generating an initial netlist from a first logic synthesis model;

generating a set of initial test vectors from the initial netlist;

simulating the initial netlist using the set of initial test vectors;

modifying a first logic circuit design of the first logic synthesis model to generate a second logic synthesis model;

generating a second netlist from the second logic synthesis model;

simulating the second netlist with the set of initial test vectors to generate a second set of test vectors;

comparing the initial set of test vectors and the second set of test vectors to determine a difference therebetween; and determining if any differences in the initial set of test vectors and the second set of test vectors are due to differences in output vectors generated by initial logic circuits of the initial logic synthesis model and corresponding second logic circuits of the second logic synthesis model, wherein the initial logic circuits and the second logic circuits are functionally equivalent.

19. The method of claim 18, further comprising removing from the logic design synthesis verification any of the initial logic circuits and the corresponding second logic circuits which are functionally identical and generate different output vectors in response to the initial set of test vectors.

20. The method of claim 18, wherein generating the initial netlist comprises providing an information file pertaining to at least an input pin name and the input pin type.

21. The method of claim 18, wherein generating the second netlist comprises providing an information file pertaining to at least an input pin name and the input pin type.

* * * * *